United States Patent
Pardo et al.

(10) Patent No.: US 7,629,663 B2
(45) Date of Patent: Dec. 8, 2009

(54) MSM TYPE PHOTODETECTION DEVICE WITH RESONANT CAVITY COMPRISING A MIRROR WITH A NETWORK OF METALLIC ELECTRODES

(75) Inventors: Fabrice Pardo, Vitry sur Seine (FR); Stephane Collin, Paris (FR); Jean-Luc Pelouard, Paris (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 0 days.

(21) Appl. No.: 10/521,879

(22) PCT Filed: Jul. 24, 2003

(86) PCT No.: PCT/FR03/02343

§ 371 (c)(1),
(2), (4) Date: Jan. 21, 2005

(87) PCT Pub. No.: WO2004/012275

PCT Pub. Date: Feb. 5, 2004

(65) Prior Publication Data

US 2006/0151807 A1 Jul. 13, 2006

(30) Foreign Application Priority Data

Jul. 25, 2002 (FR) .................................. 02 09430

(51) Int. Cl.
*H01L 31/058* (2006.01)
(52) U.S. Cl. .................. 257/448; 257/185; 257/189; 257/436; 257/457; 257/E31.065
(58) Field of Classification Search .............. 257/185, 257/E31.065, 189, 436, 448, 457
See application file for complete search history.

(56) References Cited

U.S. PATENT DOCUMENTS 5,227,648 A 7/1993 Woo (Continued)

FOREIGN PATENT DOCUMENTS

EP 0 651 448 A1 3/1995

(Continued)

OTHER PUBLICATIONS

Rong-Hen Yuang, "High-responsivity InGaAs MSM photodetectors with semi-transparent Schottky contacts", Nov. 1995, Photonics Technology Letters, IEEE, vol. 7 pp. 1333-1335.*

(Continued)

*Primary Examiner*—Wael Fahmy
*Assistant Examiner*—John C Ingham
(74) *Attorney, Agent, or Firm*—Pearne & Gordon LLP

(57) ABSTRACT

This invention relates to an MSM type photo-detection device designed to detect incident light and comprising reflecting means (2) superposed on a support (1), to form a first mirror for a Fabry-Pérot type resonant cavity, a layer of material (3) that does not absorb light, an active layer (4) made of a semiconducting material absorbing incident light and a network (5) of polarization electrodes collecting the detected signal. The electrodes network is arranged on the active layer and is composed of parallel conducting strips at a uniform spacing at a period less than the wavelength of incident light, the electrodes network forming a second mirror for the resonant cavity, the optical characteristics of this second mirror being determined by the geometric dimensions of the said conducting strips. The distance separating the first mirror from the second mirror is determined to obtain a Fabry-Pérot type resonance for incident light between these two mirrors.

20 Claims, 3 Drawing Sheets

U.S. PATENT DOCUMENTS

| | | | |
|---|---|---|---|
| 5,512,763 A * | 4/1996 | Allam | 257/21 |
| 5,663,639 A | 9/1997 | Brown et al. | |
| 5,945,720 A * | 8/1999 | Itatani et al. | 257/432 |
| 6,528,827 B2 * | 3/2003 | Henning | 257/187 |
| 2003/0010979 A1 | 1/2003 | Pardo et al. | |

FOREIGN PATENT DOCUMENTS

| | | |
|---|---|---|
| FR | 2 803 950 | 7/2001 |
| FR | 2803950 A1 | 7/2001 |

OTHER PUBLICATIONS

Yuang, R.H., "Effects of finger width on large-area InGaAs MSM photodetectors", Jan 1996, Electronics Letters, vol. 32 Issue 2, pp. 131-132.*

Katsumi Kishino et al., Resonant Cavity-Enhanced (RCE) Photodetectors, Aug. 8, 2001, pp. 2025-2034.

Wolfgang Kowalsky et al., "High Bandwidth Metal-Semiconductor-Metal Photodiodes with Integrated Fabry-Perot Resonator for WDM Receivers", Aug. 1992, pp. 214-216.

A. Strittmatter et al., "High-Speed, High Efficiency Resonant-Cavity Enhanced InGaAs MSM Photodetectors", pp. 1231-1232, Jun. 20, 1996.

A. Strittmatter et al., "High-Frequency, Long-Wavelength Resonant-Cavity-Enhanced InGaAs MSM Photodetectors", Sep. 15, 1996, pp. 145-148.

* cited by examiner

MSM TYPE PHOTODETECTION DEVICE WITH RESONANT CAVITY COMPRISING A MIRROR WITH A NETWORK OF METALLIC ELECTRODES

TECHNICAL DOMAIN

This invention relates to an MSM type photo-detection device with resonant cavity comprising a mirror with an electrodes network.

STATE OF PRIOR ART

An ultra-fast photo-detector (response time less than 1 ps) is now a crucial element for very high-speed optical fiber telecommunications (100 Gbits/s and faster). The required performances are high sensitivity and a wide passband in the 1.3 and 1.55 µm wavelengths. Regardless of the type of photo-detector (PN diode, PIN diode, Metal-Semiconductor-Metal or MSM structure), the target speed necessitates a short distance between electrodes (less than 100 nm) and that light is absorbed in a minimum volume.

Therefore existing photo-detectors require a compromise between efficiency and speed. Thus, the solid InGaAs semiconductor with a characteristic absorption length of about 3 µm at the wavelength of 1.55 µm, the reduction in the transit time of charge carriers is directly related to a reduction in the external quantum efficiency in PIN diodes and in MSM structures.

Therefore, if existing photo repeaters were used, the increase in the speed of optical telecommunications would require a large increase in the number of repeaters on the transmission line and therefore in the cost of the transmission line.

Ultra-fast MSM photo-detectors (several hundred GHz) must have a thin absorbent layer and a space between electrodes less than the wavelength.

The first constraint severely limits the sensitivity, as described in the article "High-Speed InGaAs Metal-Semiconductor-Metal Photo-detectors with Thin Absorption Layers" by W. A. Wohlmuth et al., IEEE Photon. Tech. Lett., Vol. 9, No. 5, 1997, pages 654 to 656.

The second constraint also severely limits the sensitivity. The literature describes two aspects of this constraint: firstly, an electrode shadowing effect, and secondly a diffraction effect leading to weak penetration of light into the device. Further information about this subject is given in the article entitled "High-Responsivity InGaAs MSM Photo-detectors with Semi-Transparent Schottky Contacts" by R. H. Yuang et al., IEEE Photon. Tech. Lett., Vol. 7, No. 11, 1995, pages 1333 to 1335.

Research is being carried out in two different directions to overcome this difficulty. PIN or Schottky photodiodes associated with a resonant cavity are capable of maintaining high quantum efficiency, but their cutoff frequency is limited to about 100 GHz for devices with a surface area of 100 µm². Further information about this subject is given in the article entitled "Resonant Cavity-Enhanced (RCE) Photo-detectors" by K. Kishino et al., IEEE J. Quantum Electron., Vol. 78, No. 2, 1995, pages 607 to 639.

More recently, photo detectors with propagative waves have been studied. Unlike previous structures, lighting is lateral, in other words perpendicular to the displacement of charge carriers. These structures were designed to act as an optical wave-guide and a TEM electrical wave-guide. The limitation due to the capacity (charge constant RC) is then replaced by a limitation due to the mismatch between the speeds of the optical and electrical groups. Further information about this subject can be found in the article "Traveling-Wave Photo-detectors" by K. S. Giboney et al., IEEE Photon. Techn. Lett., Vol. 4, No. 12, 1992, pages 1363 to 1365.

PRESENTATION OF THE INVENTION

According to this invention, it is proposed to overcome the disadvantages of devices according to prior art by concentrating light in a resonant manner in an MSM structure with a small active volume. Resonance is of the Fabry-Pérot type between a mirror with high reflectivity (for example a Bragg mirror) at the bottom of the device and a metallic electrodes network at the surface. The period of the electrodes network is less than the wavelength of incident light. Reflectivity of this electrodes network (the second mirror in the Fabry-Pérot cavity) is controlled by the geometric parameters of the network. The cavity thus made comprises two parts: a thin absorbent layer in which the photo-carriers are generated, and a non-absorbent layer. The shortness of the paths to be followed by the photo carriers to be collected by the electrodes assures that this device has an extremely fast intrinsic behavior (response time less than one picosecond) while resonant coupling with incident light assures a high external quantum efficiency (typically 10 times greater than the best performances at the present time).

Therefore, the purpose of the invention is an MSM type photo-detection device designed to detect incident light and comprising reflecting means superposed on a first face of a support to form a first mirror for a Fabry-Pérot type resonant cavity, a layer of material that does not absorb said light, an active layer made of a semiconducting material absorbing incident light and a network of polarization electrodes collecting the detected signal, the electrodes network being arranged on the active layer, the electrodes network being composed of parallel conducting strips at a uniform spacing at a period less than the wavelength of incident light, the electrodes network forming a second mirror for the resonant cavity, the optical characteristics of this second mirror being determined by the geometric dimensions of said conducting strips, the distance separating the first mirror from the second mirror being determined to obtain a Fabry-Pérot type resonance for incident light between these two mirrors.

The reflecting means forming a first mirror may be composed of a Bragg mirror, for example composed of alternating layers of AlAs and AlGaAs and alternating layers of GaInAsP and InP or alternating layers of AlGaInAs and AlInAs or alternating layers of AlGaAsSb and AlAsSb.

They may also be composed of a metallic layer. Preferably, the metallic layer forming the first mirror provides a silver, gold or aluminium surface to incident light.

They may also be composed of a multilayer dielectric mirror.

The layer of material that does not absorb light may be made of $Al_xGa_{1-x}As$ and the active layer may be made of GaAs. Preferably, x is of the order of 0.35 for operation at a wavelength of approximately 800 nm.

The layer of material that does not absorb light may also be made of AlInAs and the active layer may be made of InGaAs for operation at a wavelength of approximately 1500 nm.

The electrodes network may form two interdigitated combs. As a variant, the electrodes network may be composed of said conducting strips that are adjacent to each other and connected in floating potential.

Advantageously, the conducting strips are made of silver or gold.

A passive layer of dielectric material may be deposited on the electrodes network, for example a silicon dioxide or silicon nitride layer.

Possibly, a second face of the support supports an electrode to apply an electrical field to the device to change the resonant wavelength of the resonant cavity by the opto-electric effect.

BRIEF DESCRIPTION OF THE DRAWINGS

The invention will be better understood and other advantages and specific features will become clear after reading the following description given as a non-limitative example, accompanied by the attached drawings among which.

DETAILED PRESENTATION OF PARTICULAR EMBODIMENTS

The structure proposed by this invention is composed of a network of metallic electrodes arranged on a thin layer of a semiconducting material absorbing light to be detected, this thin layer being deposited on a transparent layer that is deposited on a lower mirror. The invention uses firstly partial transmission of incident waves (in TE and TM polarization) through the electrodes network that acts as a semi-reflecting mirror (upper mirror), and secondly resonance between the upper and lower mirrors. A very large proportion of incident light can then be absorbed very close to the electrodes, in the active layer that may be 50 nm thick.

The presence of a passivation layer deposited on the electrodes network imposes a slight modification of network parameters and the distance between two mirrors, without affecting the existence of resonance used in the invention.

A third electrode placed on the back face of the device uses the electro-optic effect to change the resonant wavelength, when an electric field is applied perpendicular to its surface, and therefore provides a means of tuning the photo-detector to the wavelength.

Figure 1:
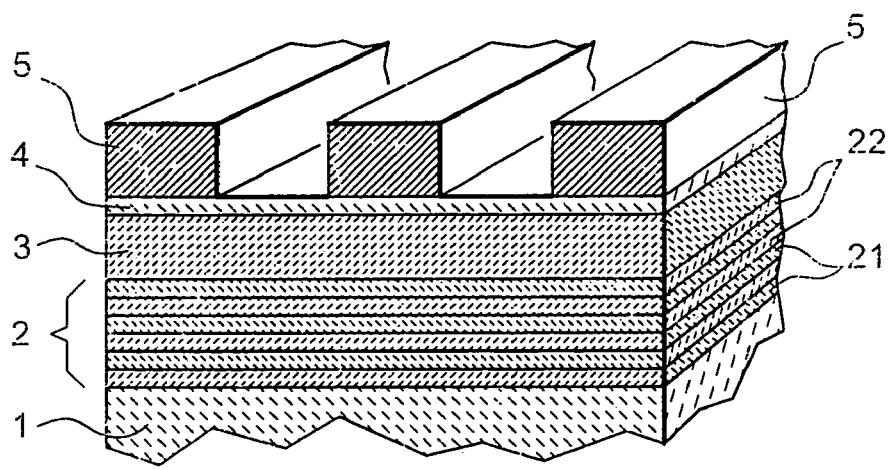
FIG. 1 is a partial perspective and sectional view of a photo-detection device according to this invention.

FIG. 1 shows a partial perspective and sectional view of a photo-detection device according to this invention. The photo-detection device is made from a GaAs substrate 1. Reference 2 denotes the lower mirror that in this case is a Bragg mirror. This Bragg mirror is composed of an alternating stack of layers 21 and 22 made of materials that do not absorb light and have different refraction indexes. With a GaAs substrate, the Bragg mirror may be an alternation of AlAs and AlGaAs layers. The thicknesses of these layers are calculated as a function of the range of wavelengths to be reflected. The layers 21 and 22 may be obtained by epitaxy (for example epitaxy by molecular jet) on substrate 1.

The next step is to make successive depositions on the lower mirror 2 of a layer 3 that does not absorb light to be detected and an active layer 4. These layers may also be deposited by epitaxy. The layer 3 may be made of $Al_xGa_{1-x}As$ with a coefficient x optimally chosen to be equal to 0.35. The active layer 4 may then be made of GaAs. It supports a network of gold, silver or aluminium electrodes 5. The electrodes 5 are composed of parallel strips at a uniform spacing. The geometric dimensions of the strips are chosen to form the upper mirror at the interface between the electrodes network 5 and the active layer 4.

For example, for a wavelength of incident light equal to about 790 nm, the distance separating the lower and upper mirrors may be 70 nm, including 40 nm in the absorbent layer and 30 nm in the transparent layer, the period of the electrode layer network may be 200 nm and the conducting strips may be 100 nm wide and 30 nm thick.

This structure is different from resonant MSM structures proposed in the past because, according to the invention, bringing the electrodes closer together no longer has the disadvantage of masking light, but also plays a fundamental role in controlling the reflectivity of the upper mirror.

If we consider the intensity of the electrical component of the electromagnetic field in the absorbent layer for received incident light, it is found that absorption is very conducive to collection of carriers in TE polarization because it is done mainly between electrodes, thus minimizing the photo-carrier collection time. In TM polarization, the electromagnetic field is located in a region with a weak static electric field, which is not conducive to fast collection of photo-carriers.

Figure 2:
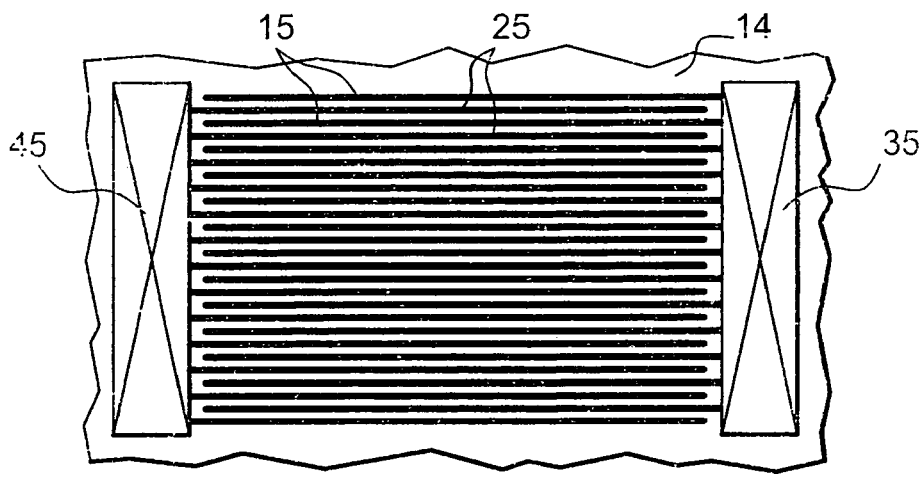
FIGS. 2 and 3 are top views of an interdigitated variant of a photo-detection device according to this invention.

The geometry of electrodes may be of the interdigitated type as shown in FIG. 2, which is a top view of a device according to the invention. The electrodes network is arranged on the active layer 14. It is composed of parallel strips. 15 electrically connected to a common contact 35 to form a first comb, and parallel strips 25 electrically connected to another common contact 45 to form a second comb. The two combs are interdigitated. In this example, the surface covered by the electrodes network is 5 µm×5 µm.

Figure 3:
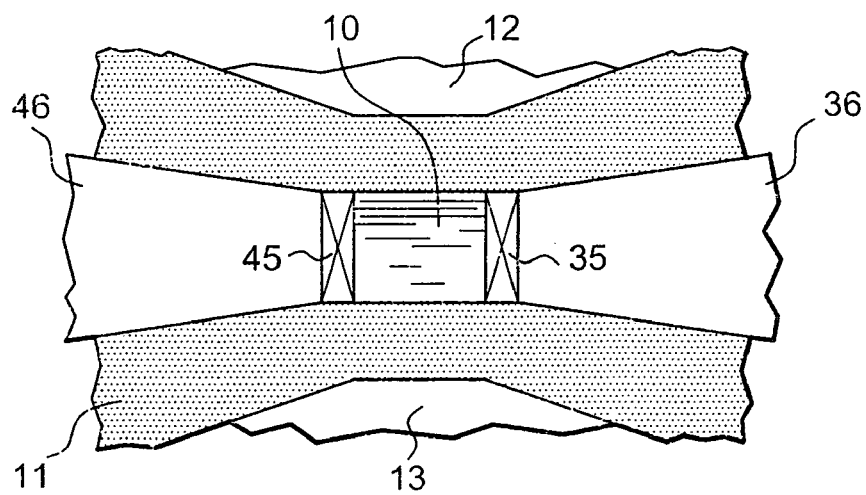

FIG. 3 is also a top view in which the device illustrated in FIG. 2 is denoted as reference 10. It is made on a substrate reference 11. The contacts 35 and 45 are clearly seen. The metallic strips (references 15 and 25 on FIG. 2) are not shown.

FIG. 3 shows conducting tracks 36 and 46 connecting contacts 35 and 45 respectively and deposited on substrate 11. The substrate 11 also supports metallizations 12 and 13 surrounding the photo-detection device 10 and the conducting tracks 36 and 46. The assembly composed firstly of the metallic tracks 12, 13 and 46, and secondly of the metallic tracks 12, 13 and 36 forms coplanar lines with controlled impedance for propagation of the photocurrent signal produced.

The electrodes can also be composed of adjacent conducting strips with floating potential as described in document FR-A-2 803 950.

FIGS. 4A to 4F illustrate the production of an electrodes network with the associated contacts for a photo-detection device according to this invention. These figures show cross-sectional views as in FIG. 1.

Figure 4A:
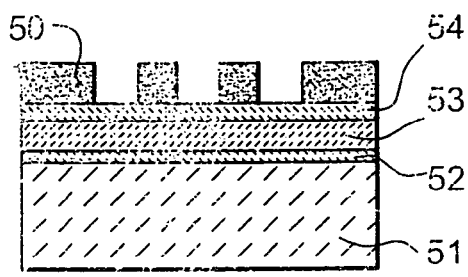
FIGS. 4A to 4F illustrate the manufacture of an electrodes network and the associated contacts for a photo-detection device according to this invention.
Figure 4B:
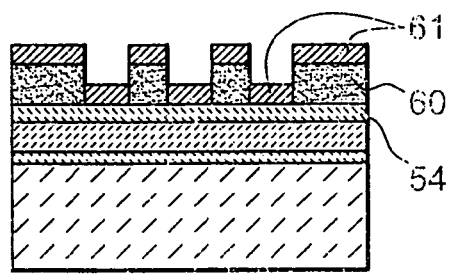

FIG. 4A shows a substrate 51 supporting a sequence composed of a lower mirror 52, a non-absorbent layer 53 and an active layer 54. If the substrate is made of GaAs, the lower mirror may be a Bragg mirror composed of an alternation of AlAs and AlGaAs layers (8 or 16 pairs of layers), the non-absorbent layer is a layer of $Al_xGa_{1-x}As$ and the active layer is a layer of GaAs. A layer 60 made of polymethyl methacrylate PMMA with a thickness of 100 nm, was deposited on the active layer 54. Openings are formed in the layer 60 by electronic lithography until the active layer 54 is reached in order to make the electrodes network. Therefore, these openings may be 100 nm wide.

A silver or gold layer is then deposited on the etched PMMA layer, with a thickness of 30 nm. This silver or gold layer is represented as reference 61 on FIG. 4B. It is supported on the remaining layer 60 and on the parts of the active layer 54 that were exposed by etching.

Figure 4C:
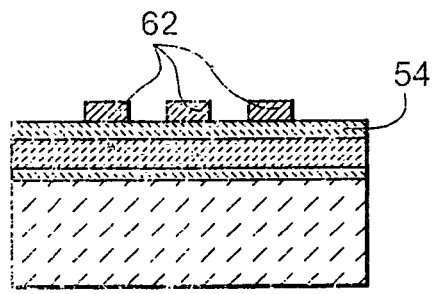

The next step is to carry out a "lift-off" operation by dissolution of PMMA in trichloroethylene. The result obtained is shown in FIG. 4C. The active layer 54 supports a network of electrodes represented as global reference 62.

Figure 4D:
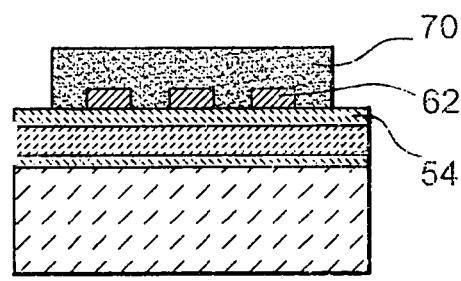

A resin layer 70 is then deposited on the active layer 54 supporting the electrodes network 62. An optical lithography operation then etches the resin layer 70 to expose the active layer 54 at the locations provided for the contacts associated with the electrodes. This is shown in FIG. 4D.

Figure 4E:
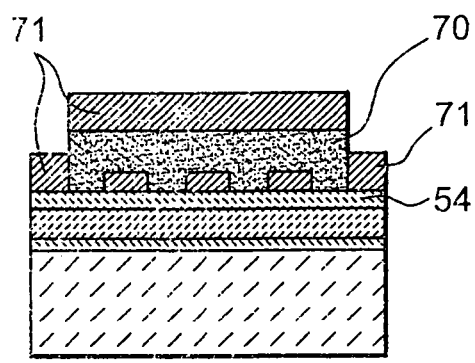

The next step is illustrated in FIG. 4E showing a layer 71 made of the same metal as the electrodes network, or of another metal, that was deposited on the remaining resin layer 70 and on the parts of the active layer 54 exposed by etching. Layer 71 is thicker than layer 61 (see FIG. 4B).

Figure 4F:
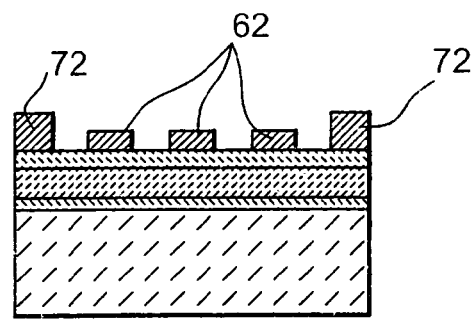

The next step is to carry out another "lift-off" operation to obtain the structure shown in FIG. 4F. Reference 72 denotes the contacts associated with the electrodes network 62.

Figure 5A:
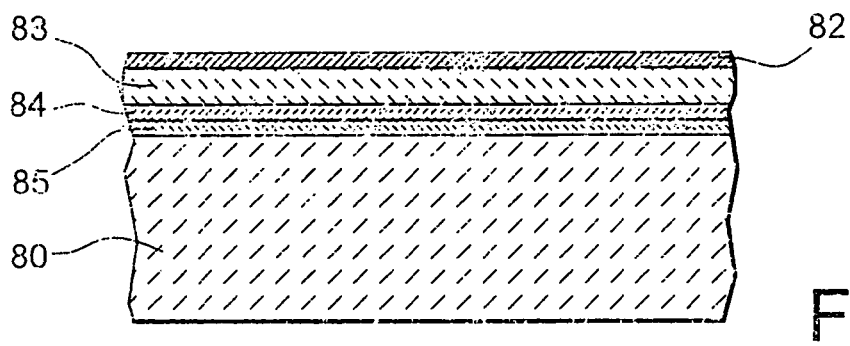
FIGS. 5A to 5C illustrate steps in a process for manufacturing another photo-detection device according to this invention.
Figure 5B:
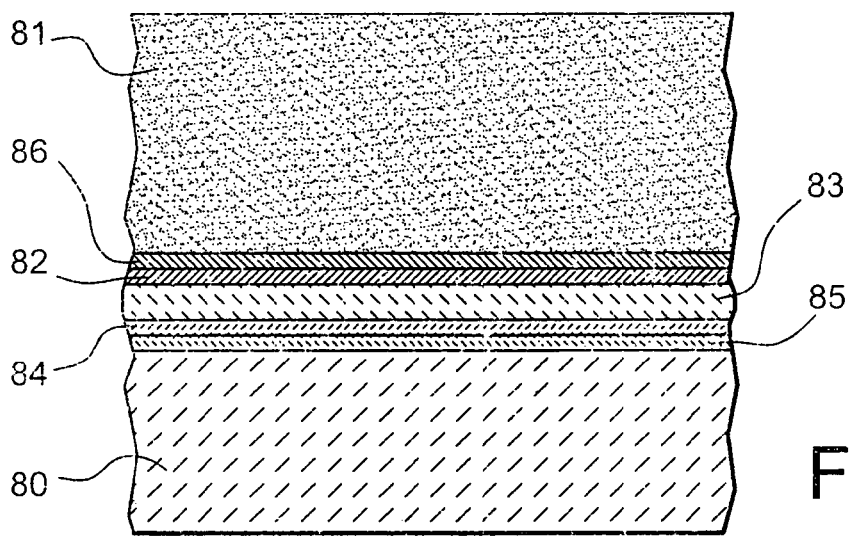
Figure 5C:
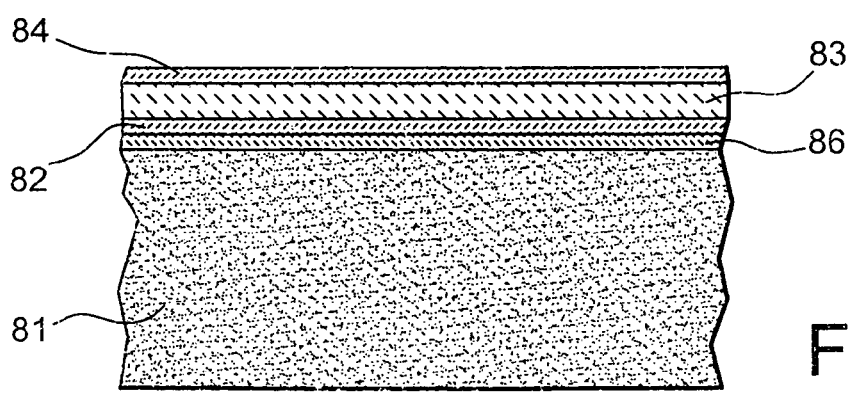

FIGS. 5A to 5C illustrate the steps in a process for manufacturing another photo-detection device according to this invention. In this variant, the lower mirror is composed of a metallic layer. These figures show cross-sectional views as in FIG. 1.

FIG. 5A shows a semiconductor substrate 80 supporting, in sequence, a stop layer 85, an active layer 84, a non-absorbent layer 83 and a metallic layer 82 designed to form the lower mirror. If the substrate 80 is made of GaAs, the stop layer 85 may be made of GaInP, the active layer 84 may be GaAs and the non-absorbent layer 83 may be $Al_xGa_{1-x}As$. The metallic layer 82 may be a dual layer comprising a first under-layer made of silver adjacent to the non-absorbent layer 83. The metallic layer also comprises a second under-layer that will be used for subsequent brazing and may, for example, be composed of gold and germanium alloy. The lower mirror may also be a multilayer dielectric mirror.

FIG. 5B shows the previous structure fixed to a support 81. Solidarization was achieved by soldering between the metallic layer 82 and a solder layer 86 deposited on the support 81. The support 81 may be made of any material compatible with the process used.

The substrate 80 is then eliminated by mechanical, mechanochemical and chemical polishing until reaching the stop layer 85. The stop layer 85 is then itself eliminated by selective chemical etching to expose the active layer 84, as shown on FIG. 5C.

The remainder of the process, to obtain the electrodes network and its associated contacts, has already been described in association with FIGS. 4A to 4F.

The new MSM structure proposed by this invention comprising a resonant cavity between the Bragg mirror and a metallic "sub-wavelength" network made of gold, provides a means of absorbing more than 50% of incident light (for a wavelength of 0.8 μm) in a 40 nm thick active layer with a space between electrodes of less than 100 nm. The efficiency is thus 25 times greater than the efficiency obtained by a single passage through the absorbent layer. This efficiency may be significantly improved by using a silver network, by improving the reflectivity of the Bragg mirror and increasing the thickness of the absorbent layer.

The external quantum efficiency obtained on an experimental device with TE polarization is 15% in a 40 nm thick layer. There is no obvious technological difficulty to prevent achieving efficiencies of more than 50%.

This invention may also be used for any type of photo detector using a resonant cavity. The network of metallic electrodes is used both as a mirror for the cavity and a means of electrically polarizing the detector. For example, the device may be a PIN type connector composed of a stack of p and n type semiconducting layers forming the PIN junction and incorporating an intrinsic zone (zone I), the stack being placed in the resonant cavity, for example composed of a Bragg mirror and a mirror with a network of metallic electrodes, this network also being used for polarization of one of the p or n layers of the junction. The device may also be a Schottky type detector composed of a non-absorbent semiconducting layer placed between a Bragg mirror and a network of metallic electrodes acting as a mirror for the cavity, electrical polarization electrodes and absorbent zone.

The invention claimed is:

1. MSM type photo-detection device designed to detect incident light and comprising:
   a support;
   reflecting means superposed on a first face of the support to form a first mirror for a Fabry-Pérot type resonant cavity;
   a layer of material that does not absorb the incident light, the layer of material being disposed on the reflecting means,
   an active layer made of a semiconducting material absorbing incident light, the active layer being disposed on the layer of material that does not absorb the incident light, and
   a network of polarization electrodes collecting the detected signal, the electrodes network being arranged on the active layer, and composed of parallel conducting strips at a uniform spacing at a period less than the wavelength of incident light, wherein the light to be detected is incident onto the device through the electrodes network, the geometric dimensions of the conducting strips being determined to form a second mirror for the Fabry-Pérot type resonant cavity at the interface between the electrodes network and the active layer, the distance separating the first mirror from the second mirror being determined to obtain a Fabry-Pérot type resonance for incident light between these two mirrors.

2. Photo-detection device according to claim 1, wherein the reflecting means forming a first mirror are composed of a Bragg mirror.

3. Photo-detection device according to claim 2, wherein the Bragg mirror is composed of alternating layers of AlAs and AlGaAs and alternating layers of GaInAsP and InP or alternating layers of AlGaInAs and AlInAs or alternating layers of AlGaAsSb and AlAsSb.

4. Photo-detection device according to claim 1, wherein the reflecting means forming a first mirror are composed of a metallic layer.

5. Photo-detection device according to claim 4, wherein the metallic layer forming the first mirror provides a silver, gold or aluminium surface to incident light.

6. Photo-detection device according to claim 1, wherein the reflecting means forming a first mirror are composed of a multilayer dielectric mirror.

7. Photo-detection device according to claim 1, wherein the layer of material that does not absorb light is made of AlxGa1-xAs and the active layer is made of GaAs.

8. Photo-detection device according to claim 7, wherein x is of the order of 0.35.

9. Photo-detection device according to claim 1, wherein the layer of material that does not absorb light is made of AlInAs and the active layer is made of InGaAs.

10. Photo-detection device according to claim 1, wherein the electrodes network forms two interdigitated combs.

11. Photo-detection device according to claim 1, wherein the conducting strips are made of silver or gold or aluminium.

12. Photo-detection device according to claim 1, wherein a passive layer of dielectric material is deposited on the electrodes network.

13. Photo-detection device according to claim 12, wherein the passivation layer is made of silicon dioxide or silicon nitride.

14. Photo-detection device according to claim 1, wherein a second face of the support supports an electrode to apply an electrical field to the device to change the resonant wavelength of the resonant cavity by the opto-electric effect.

15. MSM type photo-detection device designed to detect incident light and comprising reflecting means superposed on a first face of a support to form a first mirror for a Fabry-Pérot type resonant cavity, a layer of material that does not absorb said light, an active layer made of a semiconducting material absorbing incident light and a network of polarization electrodes collecting the detected signal, the electrodes network being arranged on the active layer, the electrodes network being composed of parallel conducting strips at a uniform spacing at a period less than the wavelength of incident light, the electrodes network forming a second mirror for the resonant cavity, wherein the light to be detected is incident onto the device through the electrodes network, the optical characteristics of this second mirror being determined by the geometric dimensions of said conducting strips, the distance separating the first mirror from the second mirror being determined to obtain a Fabry-Pérot type resonance for incident light between these two mirrors, and wherein the distance separating the first mirror from the second mirror is in the range of about 70 nanometers to about 90 nanometers.

16. Photo-detection device according to claim 15, wherein a thickness of the active layer is equal to or less than about 50 nanometers.

17. Photo-detection device according to claim 16, wherein the thickness of the active layer is equal to or less than is equal to or less than about 40 nanometers.

18. Photo-detection device according to claim 15, wherein the electrodes network is composed of the parallel conducting strips at a uniform spacing at a period equal to or less than about 200 nanometers.

19. Photo-detection device according to claim 18, wherein a width of the parallel conducting strips is equal to or less than about 100 nanometers.

20. Photo-detection device according to claim 15, wherein the electrodes network forms two interdigitated combs, including a first set of the parallel conducting strips electrically connected to a first common contact to form a first comb, and a second set of the parallel conducting strips electrically connected to a second common contact to form a second comb.

* * * * *